United States Patent [19]

Johnson et al.

[11] Patent Number: 4,729,911

[45] Date of Patent: Mar. 8, 1988

[54] WOOD GOLF CLUB HEADS, PROCESS OF TREATING THEM, AND APPARATUS

[76] Inventors: Louis W. Johnson; Bruce G. Johnson, both of 2435 Prairie Rd., Eugene, Oreg. 97402

[21] Appl. No.: 879,415

[22] Filed: Jun. 27, 1986

[51] Int. Cl.4 .......................... B05D 1/18; B05D 3/00; C23C 14/00

[52] U.S. Cl. ...................................... 427/297; 118/50; 118/429; 427/440

[58] Field of Search ........................ 427/297, 298, 440; 118/50, 429

[56] References Cited

U.S. PATENT DOCUMENTS 4,504,520 3/1985 Kurahashi ........................ 427/297 X 4,637,952 1/1987 Rosenlund .......................... 427/297

*Primary Examiner*—Michael R. Lusignan

*Attorney, Agent, or Firm*—Eugene M. Eckelman

[57] ABSTRACT

Wood golf club heads are first subjected to a vacuum and then immersed in a solution of resin while under a source of vacuum condition. The heads are then subjected to an elevated pressure. The pressure is then removed and the heads dried. Apparatus for effectively carrying out the process utilizes a treatment chamber arranged to receive one or more of the heads. This chamber is associated with vacuum and elevated pressure supply apparatus to selectively subject the chamber to vacuum or pressure. A resin chamber is supported on top of the treatment chamber and has a valved conduit for controlling the supply of resin introduced to the treatment chamber.

5 Claims, 3 Drawing Figures

WOOD GOLF CLUB HEADS, PROCESS OF TREATING THEM, AND APPARATUS

BACKGROUND OF THE INVENTION

This invention relates to new and useful improvements in wood golf heads, in the process of treating them, and to an apparatus for accomplishing the process.

Driver and fairway type heads are generally treated with oils such as linseed oils or specially compounded oils that will soak into the wood and gradually harden. In one known prior process, untreated heads are immersed in resin and simultaneously subjected to a vacuum. After that, air is let back in at atmospheric pressure. This achieves penetration of the resin into the wood. However, it is found by this prior process that the resin barely penetrates the wood and furthermore frequently an interaction occurs which causes bubbles to form in the resin. Not only do such bubbles interfere with penetration of the resin into the wood and the toughness and degree of moisture penetration but also the exterior coating on the club is not as uniform in surface texture as is desired.

SUMMARY OF THE INVENTION

According to the present invention, it is an objective to provide a process and apparatus which accomplish improved treatment of wood golf club heads and more particularly such a process and apparatus which provide deeper and uniform bubble-free penetration of a coating material and a application to the exterior surface which produces a uniform surface texture.

It is a more particular object to provide a process and apparatus of the type described which employs a novel combination of steps of vacuum and pressure treatment and application of a coating material to accomplish the above mentioned objectives.

Said objectives are achieved by utilizing a low viscosity coating material having extended pot life and to an improved process and apparatus for applying the coating material. As a first step in the process, the wood heads are placed in an enclosing chamber and the air withdrawn and held for a selected time. Thereupon, viscous coating material is introduced in the vacuum chamber to fully immerse the heads while they are subjected to the vacuum. The chamber with the heads therein is then subjected to above atmospheric conditions for a selected time. After such selected time, the pressure is relieved and the clubs removed. The coating material is then allowed to cure at room or elevated temperatures. Novel and particular apparatus is provided which is capable of carrying out the process.

The invention will be better understood and additional objects and advantages will become apparent from the following description taken in connection with the accompanying drawings.

DETAILED DESCRIPTION OF A PREFERRED EMBODIMENT

Figure 1:
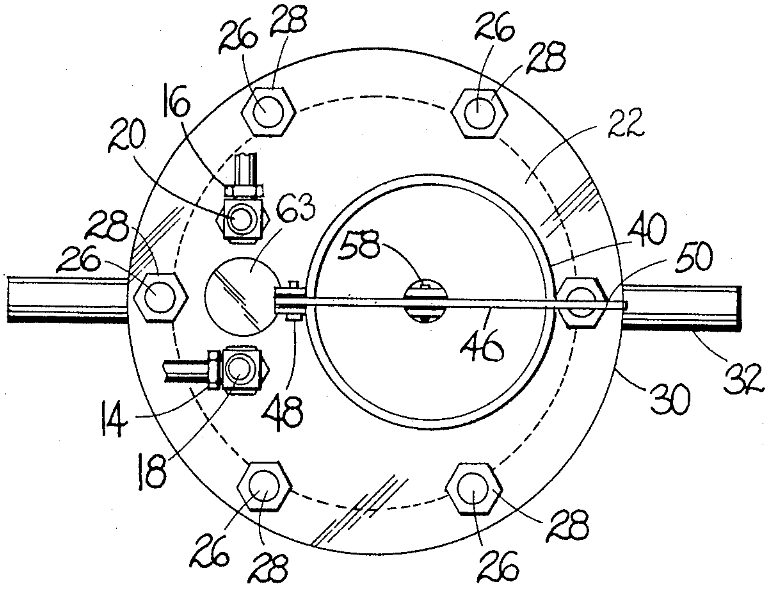
FIG. 1 is a top plan view of apparatus for carrying out the process of the invention.
Figure 2:
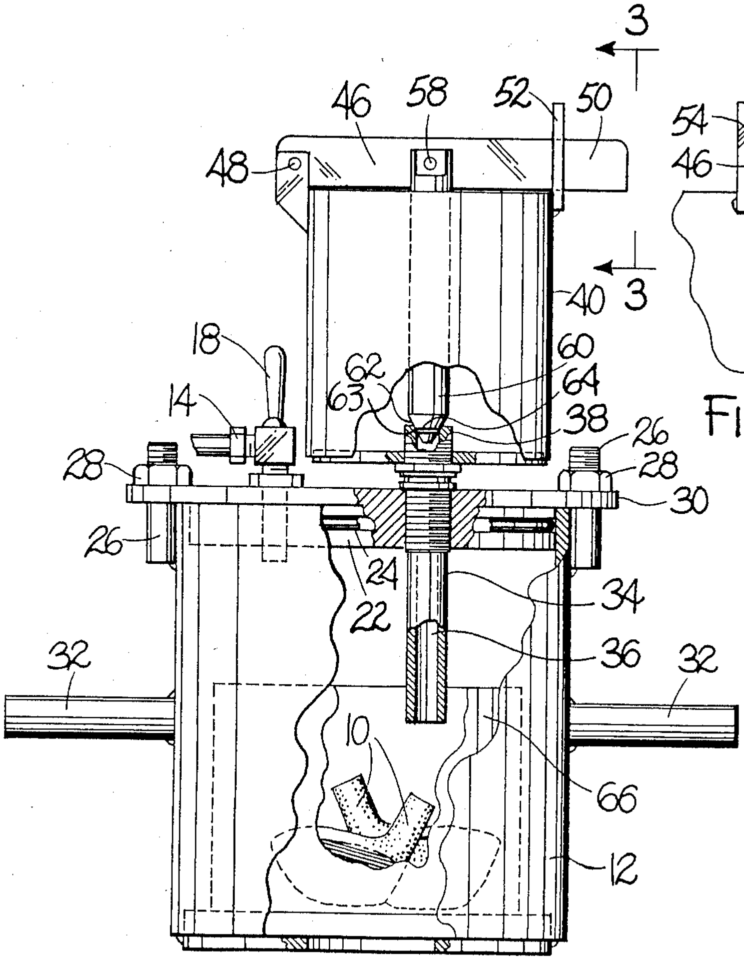
FIG. 2 is an elevational view of the apparatus which is partly broken away and which show a plurality of wood heads in an immersing chamber for treatment according to the invention.
Figure 3:
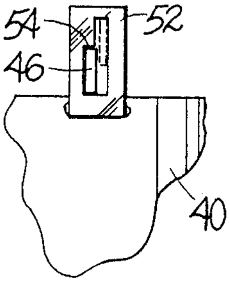
FIG. 3 is a fragmentary elevational view taken on the line 3—3 of FIG. 2.

With reference first to the drawings which show apparatus for carrying out the process, the numeral 10 in FIG. 2 represents golf club heads which generally are of persimmon or other desired wood and shaped and finished in raw wood form. A plurality of heads may be treated simultaneously.

The apparatus comprises a vacuum-pressure chamber or container 12 having suitable fittings 14 and 16 for the introduction of vacuum and pressure, respectively. These fittings include three-way valves 18 and 20, respectively, for the introduction or relief of the vacuum and pressure, and an off position. These fittings are secured in a cover 22 for the chamber 12 having airtight sealing means 24 with the container. The cover 22 is firmly held removably in place by a plurality of studs 26 and nuts 28 associated with a flange 30 on the cover. The chamber 12 has handles 32.

Cover 22 threadedly supports a fitting 34 having a bottom spout 36 and an upper threaded end 38 arranged for threaded attachment to a coating material chamber 40 for providing a connected support of the chamber on the vacuum-pressure chamber 12. The upper end of chamber 40 is open. A valve operating lever 46 has pivot support 48 on one side of chamber 40 and has a handle portion 50 projecting beyond one side of the chamber. The handle end of the lever 46 is associated with a latch 52 having a stepped slot 54. The upper portion of slot 54 allows the lever 46 to move up to a release position and the lower portion of the slot holds the lever down, these positions being achieved by lateral shifting of the lever and for a reason now to be described.

Pivotally connected at 58 to an intermediate point on the lever 46 is a rod-like valve member 60 having a tapered valve end 62 engageable with a seat 63 in the fitting 34 and having a sealed engagement therewith by means of an O-ring seal 64. Valve 62 is seated when the lever is in the lower portion of slot 54 whereby to seal off the flow of coating material to the chamber 12 and this lever can be moved into the upper portion of slot 54 to allow coating material to flow through the valve 62 into the chamber 12 at a controlled rate. A viewing window 63, such as plexiglass, is provided in the cover 22 of the chamber 12 for observing fluid level.

Broadly, the process is carried out as follows: A number of the wood heads 10 in their raw wood form are placed in the chamber 12. Preferably these heads are placed in a separate open top container 66 such as a container of a disposable type. This container is of selected height and the spout 36 of a sufficient length and vertical alignment to direct coating material efficiently into such container. With the chamber 12 sealed to atmosphere by its cover and prior to admitting the coating material, air is withdrawn from such chamber and this vacuum is held for a selected time. By means of this step the wood in the head is voided of entrained air for good reception of the coating material.

After a selected time period of subjecting the heads to vacuum and while the clubs are still in this vacuum environment, coating material from chamber 40 is admitted by operation of valve 60 by lever 46. That is, lever 46 is moved over into alignment with the upper portion of slot 54 and raised selectively to allow coating material to enter the chamber 12. This flow of coating material is viewed through top window 63 and is continued until the club heads in the container 66 are covered. Thereupon, the vacuum valve is closed and the chamber 12 charged with air pressure. After a selected pressure time, the pressure is relieved and the chamber 12 brought to atmospheric pressure. The club heads are then removed and air dried at room temperature and/or at elevated temperatures. The process is then repeated for the next batch, using the remaining coating material until near the end of its pot life and any makeup material as necessary.

The following examples are exemplary of the process:

EXAMPLE I

A number of raw wood heads were put in a disposable container 66 in chamber 12 in a dry state. The chamber 12 was sealed to atmosphere and a vacuum of approximately 26 inches of mercury applied. This vacuum was held for approximately 10 minutes. Thereupon, coating material was admitted from chamber 40 to chamber 12 while still maintaining the vacuum in the latter chamber. The coating material was admitted in an amount sufficient to cover the heads. The vacuum valve was closed and the pressure then raised to a minimum of 100 psi and held for approximately 10 minutes. After this period, the chamber 12 was relieved of pressure and opened to atmosphere. The heads were then air dried. The heads can also be dried in a heated environment, such as 120° F. for speeding up the drying step.

EXAMPLE II

The steps of Example I were followed except the heads were subjected to 20 inches of mercury in the vacuum step for a period of 20 minutes.

EXAMPLE III

This example was conducted as in Example II except the pressure was built up to approximately 300 psi and held for approximately 5 minutes.

The above examples are exemplary of vacuum and pressure conditions which can be used to produce an improved wood golf head. As to the penetration of the coating material into the wood, such will depend considerably on the density of the wood and also of course on the pressure used and the viscosity of the material. Various oils and resins can be used but a preferred resin which insures a uniform penetration and also good moisture resistant qualities, toughness, and bubble-free application is a low viscosity epoxy resin. Such a resin not only provides a uniform surface texture but also provides substantially uniform penetration. This aids the golfer in making straighter golf shots. The ranges of vacuum and pressure conditions may vary more than those given in the examples and such applications will vary according to their values. For example, the greater the vacuum or pressure the lesser the time for their application, and vice versa.

It is to be understood that the form of our invention herein shown and described is to be taken as a preferred example of the same and that various changes in the shape, size and arrangement of parts may be resorted to without departing from the spirit of our invention, or the scope of the subjoined claims.

Having thus described our invention, we claim:

1. The process of treating driver and fairway type wood golf club heads comprising the steps of:
   - first subjecting the heads to a vacuum source of at least 20 inches mercury and holding such vacuum for a selected time to withdraw entrained air and to stabilize the wood,
   - providing a single immersion of the heads in a solution of impregnating material while under the vacuum condition,
   - shutting off the vacuum source while the heads are still immersed,
   - subjected the heads while immersed to an elevated pressure of at least 100 psi,
   - removing the pressure condition, and drying the heads.

2. The process of claim 1 wherein said vacuum condition is carried out at approximately 26 inches of mercury.

3. The process of claim 1 wherein said pressure conditions may vary from approximately said 100 to 300 psi.

4. Apparatus for treating golf club heads consisting essentially of
   - an airtight treatment vessel arranged to receive one or more of the heads,
   - said vessel having top, bottom, and side defining walls,
   - vacuum and elevated pressure means associated with said vessel to selectively subject said vessel to vacuum and pressure,
   - a resin chamber secured to and supported on the top wall of said vessel,
   - said resin chamber having bottom and side defining walls and being open at the top,
   - conduit means extending through the bottom wall of said resin chamber and the top wall of said vessel and establishing communication in vertical alignment between said resin chamber and said airtight vessel,
   - and valve means associated with said conduit means for controlling the supply of resin into said vessel.

5. The apparatus of claim 4 including a disposable container in said vessel removably receiving the golf club heads and arranged to receive resin from said conduit means.

* * * * *